United States Patent
Brillu et al.

(10) Patent No.: US 9,594,863 B2
(45) Date of Patent: Mar. 14, 2017

(54) METHOD FOR DETERMINING BY OPTIMIZATION A MULTI-CORE ARCHITECTURE

(71) Applicants: THALES, Courbevoie (FR); UNIVERSITE DE NANTES, Nantes (FR)

(72) Inventors: Romain Brillu, Palaiseau (FR); Philippe Millet, Palaiseau (FR); Sébastien Pillement, Nantes (FR); Fabrice Lemonnier, Palaiseau (FR)

( * ) Notice: Subject to any disclaimer, the term of this patent is extended or adjusted under 35 U.S.C. 154(b) by 0 days.

(21) Appl. No.: 14/841,782

(22) Filed: Sep. 1, 2015

(65) Prior Publication Data

US 2016/0063164 A1    Mar. 3, 2016

(30) Foreign Application Priority Data

Sep. 2, 2014  (FR) ..................................... 14 01942

(51) Int. Cl.
*G06F 9/455* (2006.01)
*G06F 17/50* (2006.01)
*G06F 9/50* (2006.01)

(52) U.S. Cl.
CPC ........ *G06F 17/5068* (2013.01); *G06F 9/5066* (2013.01); *G06F 17/5009* (2013.01);
(Continued)

(58) Field of Classification Search
CPC .................................................... G06F 17/505
(Continued)

(56) References Cited

U.S. PATENT DOCUMENTS

| 8,281,265 B2 * | 10/2012 | Vorbach .............. G06F 15/7867 716/100 |
| 2004/0093572 A1 * | 5/2004 | Jain ....................... G06F 17/504 716/106 |

(Continued)

OTHER PUBLICATIONS

Preliminary Search Report dated May 27, 2015 in related French Patent Application No. 14 01942.

(Continued)

*Primary Examiner* — Suresh Memula
(74) *Attorney, Agent, or Firm* — Eric L. Lane; Green Patent Law

(57) ABSTRACT

The invention relates to a method for determining by optimization a multi-core architecture and a way of implementing an application on the architecture for a given application, the method comprising:
 providing a parallelized application and candidate architectures comprising different hardware blocks,
 defining a first exploration space whose elements are the different ways of implementing the application on each of the candidate architectures,
 selecting, in the first exploration space, the elements verifying a criterion to obtain a second exploration space,
 determining, in the second exploration space, the elements verifying a criterion to obtain a third exploration space,
 computing the number of data exchanged between the hardware blocks for each of the elements of the third exploration space to obtain a fourth exploration space, and
 optimizing the elements of the fourth exploration space according to a criterion.

10 Claims, 2 Drawing Sheets

(52) U.S. Cl.
    CPC ...... *G06F 17/5045* (2013.01); *G06F 17/5054*
              (2013.01); *Y02B 60/142* (2013.01); *Y02B*
                                          *60/167* (2013.01)

(58) Field of Classification Search
    USPC ........................................................ 716/132
    See application file for complete search history.

(56) References Cited

U.S. PATENT DOCUMENTS

2004/0243962 A1* 12/2004 Subasic ............... G06F 17/5068
                                                              716/102
2011/0302550 A1    12/2011 Jackson
2015/0154330 A1*  6/2015 Yachide .............. G06F 17/5022
                                                              716/102

OTHER PUBLICATIONS

Written Opinion in related French Patent Application No. 14 01942.
Brillu, Romain et al., "Towards a Design Space Exploration Tool for MPSoC Platforms Design: A Case Study", 2014 22nd Euromicro Int'l Conference, IEEE, Feb. 12, 2014.
Benoit Miramond et al., "OveRSoC: A Framework for the Exploration of RTOS for RSoC Platforms", Int'l Journal of Reconfigurable Computing, vol. 11, No. 3-4, Jan. 1, 2009.
Murali S. et al., "SUNMAP: A Tool for Automatic Topology Selection and Generation for NoCs", Design Automation Conference Proceedings, 41st, IEEE, Jul. 7, 2004.

\* cited by examiner

METHOD FOR DETERMINING BY OPTIMIZATION A MULTI-CORE ARCHITECTURE

BACKGROUND OF THE INVENTION

The present invention relates to a method for determining by optimization a multi-core architecture and a way of implementing an application on the architecture for a given application. The present invention also relates to the associated computer program product.

A multi-core architecture is a computing platform comprising several processing units or processing cores. Each processing unit is in particular able to execute computer programs and process data. Such processing is done in parallel, i.e., autonomously with respect to the other units. Depending on the case, a multi-core architecture also includes one or more of the following elements: a processor, a memory, a connection for input and output peripherals or a communication network, for example a network on-chip (NoC). Central processing units (CPU) and graphics processing units (GPU) are examples of multi-core architectures.

In order to design a multi-core architecture suitable for a given application, a traditional approach consists of establishing a profile of the considered application, then implementing the application on all of the candidate architectures, and lastly, jointly optimizing the architectures and the application.

However, such an approach involves many user operations, which is time-consuming and a source of errors.

Many tools aiming to explore multi-core architectures that may be suitable for a given application automatically have been developed.

Thus, it is known to use high-level synthesis (HLS) tools able to interpret an algorithmic description of a desired behavior and to create the architecture implementing that behavior.

However, for performance levels in terms of execution time of the application by the architecture, surface occupied by the architecture and energy consumed by the architecture, an architecture obtained automatically by such HLS tools does not achieve the performance that would be obtained manually.

There is therefore a need for a method for determining by optimization a multi-core architecture for a given application that is quick to implement while providing a multi-core architecture having performance levels in terms of execution time, surface and consumed energy, closer to the performances of a manual optimization technique.

SUMMARY OF THE INVENTION

To that end, the invention relates to a method for determining by optimization a multi-core architecture and a way of implementing an application on the architecture for a given application, the method comprising:
  providing a parallelized application, a parallelized application being a set of tasks,
  providing candidate architectures, each candidate architecture comprising different hardware blocks, a hardware block having a specific nature and being able to execute one or more tasks,
  defining a first exploration space whose elements are the different ways of implementing the application on each of the candidate architectures,
  selecting, in the first exploration space, the elements verifying a first criterion according to which each task of the application is suitable for being implemented on only one or several hardware blocks, to obtain a second exploration space comprising the elements of the first exploration space meeting the first criterion,
  determining, in the second exploration space, the elements verifying a second criterion, the second criterion being different from the first criterion and requiring that the number of hardware blocks separating a first hardware block implementing a first task and a second hardware block implementing a second task different from the first task, is less than or equal to a value specific to the two tasks in question, to obtain a third exploration space comprising the elements of the second exploration space meeting the second criterion,
  computing the quantity of data exchanged between the hardware blocks for each of the elements of the third exploration space and comparing each computed number to a threshold value, in order to obtain a fourth exploration space comprising the elements of the third exploration space whose number of exchanged data is less than or equal to the threshold value, and
  optimizing the elements of the fourth exploration space according to a third criterion, the third criterion being different from the first criterion and from the second criterion.

According to specific embodiments, the determining method includes one or more of the following features, considered alone or according to any technically possible combinations:
  the selection step comprises the parsimonious decomposition of the elements of the first exploration space into a dictionary, the dictionary being a matrix whose elements meet the first criterion, the elements resulting from the parsimonious decomposition belonging to the second exploration space,
  the method further comprises the following steps:
    determining, in the application, the tasks that can be performed at the same time by two separate hardware blocks of a same candidate architecture to obtain a diagram grouping all of the tasks performable in parallel,
    evaluating the needs necessary to implement each of the tasks of the application on specific hardware blocks of the candidate architectures in order to obtain a table grouping the needs of each of the tasks of the application when the considered tasks are performed on said hardware blocks,
    optimizing the application based on the table and the diagram to reduce the volume of the tasks or the volume of the data transferred between the tasks and the application,
  the first criterion is defined by a user based on the table and based on constraints specific to the candidate architectures and the application,
  the method further comprises the following steps:
    storing, in a fifth exploration space, the elements of the first exploration space which does not meet the first criterion,
    storing, in a sixth exploration space, the elements of the second exploration space which does not meet the second criterion,
    the selection step further comprising the addition of the elements of the fifth exploration space into the second exploration space and the determining step further comprising the addition of the elements of the sixth exploration space into the third exploration space, the storage steps being carried out during the method only when the optimization of the elements of the fourth exploration space does not meet the third criterion, the threshold value of the computation step is below the constraints in terms of execution time of the user, the third criterion is defined by a function whose parameters comprise the size of the architecture, the number of data transferred between the different blocks of an architecture, the bandwidth and the size of the memories of the architecture, the bandwidth of the communicators of the architecture, the computing power of the different hardware blocks and the placement of the data and of the tasks, the natures of the hardware blocks are chosen from among processors, memories and communicators, the hardware blocks making up the candidate architectures having previously been optimized for one or more functionalities or specific tasks, the optimization step according to the third user criterion implements at least one evolutionary search algorithm, such as a genetic algorithm or a taboo search algorithm.

The invention also relates to a computer program product including a readable information medium, on which a computer program is stored comprising program instructions, the computer program being able to be loaded on a data processing unit and suitable for driving the implementation of the aforementioned method when the computer program is implemented on the data processing unit.

BRIEF DESCRIPTION OF THE DRAWINGS

Other features and advantages of the invention will appear upon reading the following description of embodiments of the invention, provided solely as an example and done in reference to the drawings, which are.

DETAILED DESCRIPTION OF PREFERRED EMBODIMENTS

Figure 1:
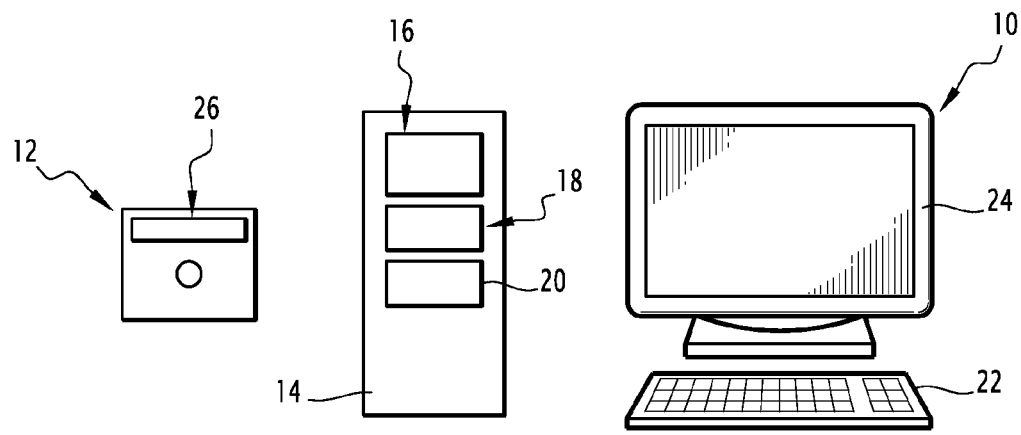
FIG. 1, a diagrammatic illustration of an example system allowing the implementation of a determining method according to the invention, FIG. 2, a flowchart of an example implementation of a determining method according to the invention, FIG. 3, an example of a diagram obtained during implementation of the determining method according to the invention, and FIG. 4, a diagram of an operating example of an algorithm used during the implementation of the determining method according to the invention.

A system 10 and a computer program product 12 are shown in FIG. 1. The interaction of the computer program product 12 with the system 10 makes it possible to implement a method for determining a multi-core architecture by optimization and a way of implementing an application on the architecture for a given application.

The system 10 is a computer.

More generally, the system 10 is an electronic computer able to manipulate and/or transform data represented as electronic or physical quantities in registers of the system 10 and/or memories into other similar data corresponding to physical data in the memories, registers or other types of display, transmission or storage devices.

The system 10 includes a processor 14 comprising a data processing unit 16, memories 18 and an information medium reader 20. The system 10 comprises a keyboard 22 and a display unit 24.

The computer program product 12 includes a readable information medium 26.

The readable information medium 26 is a medium readable by the system 10, usually by the data processing unit 14. The readable information medium 26 is a medium suitable for storing electronic instructions and able to be coupled with a bus of a computer system.

As an example, the readable information medium 26 is a floppy disk, an optical disc, a CD-ROM, a magnetic-optical disc, a ROM memory, a RAM memory, an EPROM memory, an EEPROM memory, a magnetic card or an optical card.

A computer program comprising program instructions is stored on the readable information medium 26.

The computer program can be loaded on the data processing unit 14 and is suitable for driving the implementation of a determining method of a multi-core architecture by optimization and a way of implementing an application on the architecture for a given application when the computer program is implemented on the data processing unit 14.

Figure 2:
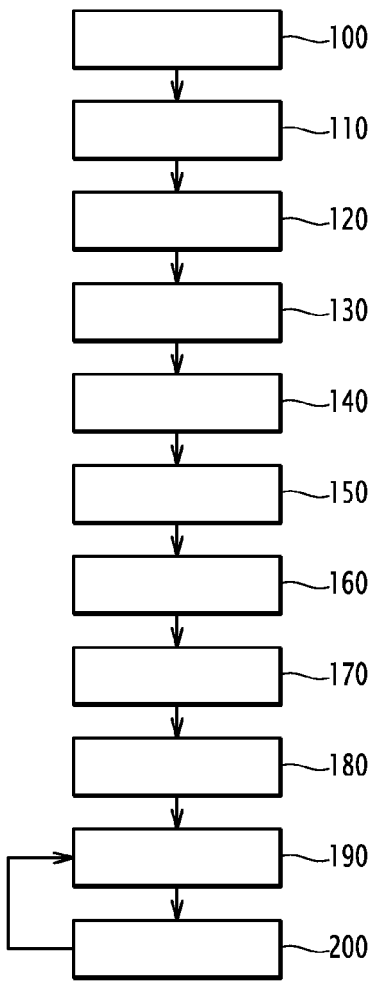

The operation of the system 10 interacting with the computer program product 12 is now described in reference to FIG. 2, which illustrates one example embodiment of a method according to the invention.

The determining method comprises a step 100 for providing a parallelized application App including a set of tasks $T_1, \ldots, T_n$.

An application App is a set of computer programs designed so as to provide a service to a user. An application App is for example used to perform word processing, spreadsheet, office automation, production management, information system, project management, compatibility or electronic document management functions.

A task $T_1, \ldots, T_n$ is an action or computation defined by an application App and generally characterized by three states: to be done", in progress" or "done". A task $T_1, \ldots, T_n$ is able to generate instructions or sequences of instructions when it is implemented on a physical system, such as an architecture. A task $T_1, \ldots, T_n$ is also able to consume data and produce data when it is implemented.

As previously described, a datum is represented as an electronic or physical quantity. Such a datum corresponds to an elementary description of a reality optionally assuming the form of computer code. A consumed datum means that the datum is used during implementation of the task $T_1, \ldots, T_n$ in question. A produced datum means that the datum is generated by the task $T_1, \ldots, T_n$ in question during the implementation of the task $T_1, \ldots, T_n$.

The concept of parallelized application designates an application App including a set of tasks $T_1, \ldots, T_n$, some of those tasks $T_1, \ldots, T_n$ being able to be performed at the same time by a physical system, for example an architecture, on which the application App is implemented. The term "implementation" designates the setup on a system such as a computer, a computing platform or an architecture of a computer program such as an application.

The step 100 for providing an application App is generally implemented by providing source code for the application App.

The determining method next comprises a step 110 for providing that candidate multi-core architectures $Ar_1, \ldots, Ar_n$, each comprising different hardware blocks $B_1, \ldots, B_n$.

A hardware block $B_1, \ldots, B_n$ has a specific nature and is able to perform one or more tasks $T_1, \ldots, T_n$.

In general, an architecture designates a structure inherent to a computer system, the organization of the elements of the system and the relationships between those elements.

A processor is an example of an architecture.

A hardware block $B_1, \ldots, B_n$ is, by definition, an element of an architecture performing a predetermined function or functionality, for example a communication function or storage function.

A same nature of hardware blocks $B_1, \ldots, B_n$ groups together, for example, the hardware blocks $B_1, \ldots, B_n$ performing a predetermined function or comprising specific components.

The natures of the hardware blocks $B_1, \ldots, B_n$ are chosen from among a group in particular including processors, memories and communicators.

A processor or CPU is a component of a computer that executes the machine instructions of the computer programs.

A machine instruction is an elementary operation that the computer program asks a processor to perform.

A computer program is a sequence of machine instructions specifying, step by step, the operations to be performed to obtain a result.

Processors are for example Commercial On The Shelf (COTS) processors or data flow accelerators.

The processors are generally able to perform tasks of an application one after another in a predetermined order. The General Purpose Processor, Domain Oriented Processor and Application Specific Instruction-Set Processor (ASIP) are examples of processors.

Data flow accelerators are generally able to perform tasks of an application once the data relative to each of the tasks is available. The performance order of the tasks is then not predetermined. A data flow accelerator is for example a computing unit producing a filter or a fast Fourier transform (FFT) computation.

A memory is a device used to store information and able to be integrated into a computer system such as a computer.

The memories are for example shared memories that can be used by several programs at the same time, those programs being implemented on one or more processors. The memories are for example distributed memories each dedicated to a processor.

A communicator is a communication system between the components of a computer system such as a computer.

The communicators are for example computer buses or NoC.

Optionally, the hardware blocks $B_1, \ldots, B_n$ making up the candidate architectures $Ar_1, \ldots, Ar_n$ have been optimized beforehand for one or more functionalities, such as a word processing or spreadsheet function, or specific tasks $T_1, \ldots, T_n$. The optimization of the hardware blocks $B_1, \ldots, B_n$ is done before the implementation of the determining method, for example, by a high-level synthesis tool or manually by a user.

The step 110 for providing architectures $Ar_1, \ldots, Ar_n$ is generally implemented by providing an architecture library to the data processing unit 16. The architecture library is, for example, represented using standard IP-XACT.

The IP-XACT standard is defined in the document "Evaluating uml2 modeling of ip-xact objects for automatic mpsoc integration onto fpga" by T. Aripinen et al. published in 2009.

The determining method next optionally comprises a step 120 for determining, in the application App, tasks $T_1, \ldots, T_n$ that can be performed at the same time by two separate hardware blocks $B_1, \ldots, B_n$ of the same candidate architecture $Ar_1, \ldots, Ar_n$. Such tasks $T_1, \ldots, T_n$ able to be performed at the same time are called "parallelizable".

The determining step 120 also makes it possible to obtain a diagram G grouping together all of the tasks $T_1, \ldots, T_n$ that can be performed in parallel.

Figure 3:
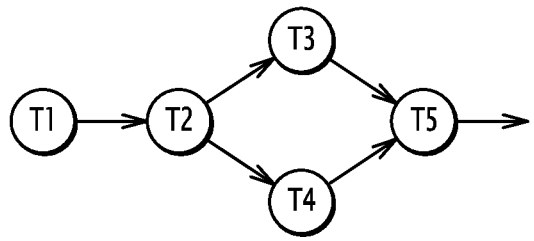

For example, as shown in FIG. 3, in such a diagram G, the tasks $T_1, \ldots, T_n$ are connected to one another by arrows modeling the performance order of the tasks $T_n$. In the example of FIG. 3, five tasks $T_1, T_2, T_3, T_4, T_5$ are shown, the tasks $T_3$ and $T_4$ being parallelizable.

Such a diagram G can be viewed by a user using the display unit 24.

The step 120 for determining tasks is generally implemented from the source code of the application App and a computing tool and/or compilation tool or a code parallelization tool. For example, step 120 is performed using the PIPS (Scientific Program Interprocedural Parallelization) compiler. The PIPS compiler makes it possible to analyze and transform programs in the C and FORTRAN (Formula Translator) languages.

The determining method optionally includes a step 130 for evaluating needs necessary for the limitation of the tasks $T_1, \ldots, T_n$ of the application App on the specific hardware blocks $B_1, \ldots, B_n$ of the candidate architectures $Ar_1, \ldots, Ar_1, \ldots, Ar_n$.

The specific hardware blocks $B_1, \ldots, B_n$ of the candidate architectures $Ar_1, \ldots, Ar_n$ are, for example, the hardware blocks $B_1, \ldots, B_n$ of a processor nature. More specifically, the specific hardware blocks $B_1, \ldots, B_n$ are COTS processors.

The evaluated needs are in particular the number of instructions necessary for performance, i.e., the implementation, of a task $T_1, \ldots, T_n$ on a specific hardware block $B_1, \ldots, B_n$.

As an example, the evaluated needs also include the ratio between the quantity of data produced by each task $T_1, \ldots, T_n$ and the quantity of data consumed by each task $T_1, \ldots, T_n$. Such a ratio thus defines the proportion of data transferred during the performance of a given task $T_1, \ldots, T_n$ on a specific hardware block $B_1, \ldots, B_n$.

Alternatively, the evaluated needs are also the execution time of each task $T_1, \ldots, T_n$ on each of the hardware blocks $B_1, \ldots, B_n$ of a processor nature.

The evaluation step 130 makes it possible to obtain a table T grouping together the needs of each of the tasks $T_1, \ldots, T_n$ of the application App when the tasks $T_1, \ldots, T_n$ in question are performed on each of the specific hardware blocks $B_1, \ldots, B_n$.

Such a table T is for example a table grouping together, for each task $T_1, \ldots, T_n$ of the application App and for each specific hardware block $B_1, \ldots, B_n$, the number of instructions and the execution time necessary to execute each of those tasks $T_1, \ldots, T_n$ on each of those specific hardware blocks $B_1, \ldots, B_n$.

Advantageously, the table T also groups together, for each task $T_1, \ldots, T_n$, the ratio between the quantity of data produced and the quantity of data consumed by the task $T_1, \ldots, T_n$.

A table T for example assumes the following form:

| | Number of instructions: | | Data produced/data consumed (kb) |
|---|---|---|---|
| | $B_1$ | ... $B_n$ | |
| $T_1$ | 12500 | ... 10500 | 2400/3600 |
| $T_2$ | 5632 | ... 5032 | 3600/4000 |
| $T_3$ | 7852 | ... 7552 | 4000/2600 |
| $T_4$ | 45236 | ... 46236 | 4000/2600 |
| $T_5$ | 78256 | ... 79256 | 2600/1300 |

| | $T_1$ | $T_2$ | $T_3$ | $T_4$ | $T_5$ |
|---|---|---|---|---|---|
| $B_1$ | 2.2 | N/A | 1.4 | 2.1 | 1.7 |
| $B_2$ | 1.45 | 1.6 | N/A | N/A | 1.05 |
| ... | ... | ... | ... | ... | ... |
| ... | ... | ... | ... | ... | ... |
| $B_n$ | N/A | 1.5 | N/A | N/A | 1.2 |

The first table groups together the needs in terms of number of instructions and ratio between the quantity of data produced and the quantity of data consumed. The second table groups together the needs in terms of execution time.

In such a table, "N/A" means that the corresponding task $T_1, \ldots, T_n$ cannot be implemented on the corresponding hardware block $B_1, \ldots, B_n$.

Such a table T can be viewed by a user using the display unit 24.

The step 130 for evaluating needs is generally implemented by drawing up the source code for the application App, i.e., by adding instructions to the original source code of the application App so as to measure the needs of the tasks $T_1, \ldots, T_n$ of the application App when they are executed.

More particularly, this evaluating step 130 is implemented by a computer tool such as a code profiler. A code profiler is a tool that consists of analyzing the execution of software or an application so as to determine its behavior during execution.

For example, the evaluation step 130 can be performed using an Open Virtual Platforms (OVP) tool. The OVP tool is interesting because it comprises a library of standardized processes, as well as a high-quality programming interface to define new hardware blocks $B_1, \ldots, B_n$ of a processor nature.

For example, the evaluating step 130 is performed using a code profiler such as a CNU profiler or a valgrind.

The method next optionally comprises a step 140 for optimizing the application App based on the table T and the diagram G.

This optimizing step 140 accounts for the desires of a user, in particular regarding the needs evaluated during the evaluating step 130.

For example, the user may wish for the needs evaluated during the evaluating step 130 to be reduced. More particularly, regarding those needs evaluated during the evaluating step 130, the user may wish for the performance time to be reduced, the number of instructions to be reduced or the ratio between the quantity of data produced and quantity of data consumed to be comprised within a predetermined value range.

The desires of the user also relate to the resources used by each hardware block $B_1, \ldots, B_n$. These resources for example take into account the load and bandwidth of the hardware blocks $B_1, \ldots, B_n$ of a memory nature or the computing power of each hardware block $B_1, \ldots, B_n$. The user may, for example, wish to modify the resources used by each hardware block $B_1, \ldots, B_n$.

The optimizing step 140 therefore aims to modify the application App at by taking a user's wishes into account.

Step 140 makes it possible to obtain an optimized application App to replace the application App supplied during the supply step 100. This optimized application App is next used for the continued implementation of the determining method.

The optimizing step 140 is implemented by the processor 14 and generally involves the intervention of a user, in particular using the keyboard 22.

The determining method next comprises a step 150 for defining a first exploration space $E_1$.

The first exploration space $E_1$ is made up of the different ways of implementing the application App on each of the candidate architectures $Ar_1, \ldots, Ar_n$. This first space $E_1$ in other words comprises all of the implementation possibilities for each of the tasks $T_1, \ldots, T_n$ of the application App on all of the hardware blocks $B_1, \ldots, B_n$ of each of the candidate architectures $Ar_1, \ldots, Ar_n$. An element of the first exploration space $E_1$ therefore corresponds to an implementation of a task $T_1, \ldots, T_n$ of the application App on a hardware block $B_1, \ldots, B_n$ of a candidate architecture $Ar_1, \ldots, Ar_n$.

The first exploration space $E_1$ is for example a matrix whereof the elements are the implementations of each task $T_1, \ldots, T_n$ on each of the hardware blocks $B_1, \ldots, B_n$ of the candidate architectures $Ar_1, \ldots, Ar_n$. For example, the matrix of the first exploration space $E_1$ comprises a number of rows corresponding to the number of tasks $T_1, \ldots, T_n$ and number of columns corresponding to the number of hardware blocks $B_1, \ldots, B_n$ of the set of candidate architectures $Ar_1, \ldots, Ar_n$.

The step 150 for defining the first exploration space $E_1$ is generally carried out by the processor 14 using the readable information medium 26.

The determining step next comprises a step 160 for selecting, in the first exploration space $E_1$, elements satisfying a first criterion $C_1$.

The first criterion $C_1$ specifies that each task $T_1, \ldots, T_n$ of the application App is able to be implemented on only one or several hardware blocks $B_1, \ldots, B_n$. The first criterion $C_1$ makes it possible to match a task $T_1, \ldots, T_n$ to a set of hardware blocks $B_1, \ldots, B_n$. Thus, the hardware blocks $B_1, \ldots, B_n$ not satisfying the first criterion $C_1$ for a considered task $T_1, \ldots, T_n$ are no longer considered to implement the considered task $T_1, \ldots, T_n$.

The first criterion $C_1$ is chosen by a user in particular by using the keyboard 22.

This selection step 160 makes it possible to obtain a second exploration space $E_2$ comprising the elements of the first exploration space $E_1$ satisfying the first criterion $C_1$.

The second exploration space $E_2$ is for example a matrix whereof the elements are the implementations of each task $T_1, \ldots, T_n$ on each of the hardware blocks $B_1, \ldots, B_n$ of the candidate architectures $Ar_1, \ldots, Ar_n$, those implementations respecting the first criterion $C_1$.

This selection step 160 comprises the parsimonious decomposition of the elements of the first exploration space $E_1$ over a dictionary D, the dictionary D being a matrix whereof the elements meet the first criterion $C_1$, the elements resulting from the parsimonious breakdown belonging to the second exploration space $E_2$.

Usually, a signal is represented in the form of a linear transform of its coefficients and is called parsimonious when most of its coefficients are approximately zero.

A parsimonious decomposition of the signal is traditionally a decomposition of the signal over a dictionary D, that dictionary D comprising a number of elements significantly higher than the dimension of the signal and such a decomposition introducing, into the new representation of the signal, a large number of zero values.

Below, the terms in bold designate vectors.

Traditionally, the solution vector y from the parsimonious decomposition of a vector signal x over the dictionary D is given in vector notations by the following equation $Eq_1$: y=D·x In the case at hand, the solution vector y defines, for each task $T_1, \ldots, T_n$ of the application App, a specific hardware block $B_1, \ldots, B_n$ of the candidate architectures $Ar_1, \ldots, Ar_n$ able to implement the considered task $T_1, \ldots, T_n$.

During a parsimonious decomposition, the choice of the dictionary D in particular influences the computing time necessary to determine the solution vector y.

The dictionary D is determined by a user, who chooses, for each task $T_1, \ldots, T_n$, a set of hardware blocks $B_1, \ldots, B_n$.

In particular, in order to determine the dictionary D, the user chooses, for each task $T_1, \ldots, T_n$, the hardware blocks $B_1, \ldots, B_n$ able to respect the constraints in terms of execution time of the application App on an architecture.

For example, if a hardware block $B_1, \ldots, B_n$ takes ten seconds to execute a first task $T_1$ and the constraint in terms of execution time of the application App is 5 seconds, said hardware block $B_1, \ldots, B_n$ is not considered in the dictionary D as a potential solution for the performance of the task $T_1$.

For example, the user defines a dictionary D based on the following table:

|       | $B_1$ | $B_2$ | $B_3$ | ... | $B_{10}$ |
|-------|-------|-------|-------|-----|----------|
| $T_1$ | 1     | 0     | 1     | ... | 1        |
| $T_2$ | 1     | 1     | 1     | ... | 1        |
| $T_3$ | 1     | 0     | 0     | ... | 0        |
| $T_4$ | 0     | 1     | 0     | ... | 1        |
| $T_5$ | 0     | 1     | 0     | ... | 1        |

In such a table, the number 1 means that the corresponding task can be implemented on the corresponding hardware block. The number 0 means that the corresponding task cannot be implemented on the corresponding hardware block.

Thus, task $T_1$ can be implemented on the hardware blocks $B_1$, $B_3$ and $B_{10}$, task $T_2$ on the hardware blocks $B_1$, $B_2$, $B_3$ and $B_{10}$ and task $T_3$ on hardware block $B_1$. Tasks $T_4$ and $T_5$ can be implemented on hardware blocks $B_2$ and $B_{10}$.

Thus, during the selection step 160, a user is asked to define the first criterion $C_1$ optionally based on the table T and based on the constraints specific to the candidate architectures $Ar_1, \ldots, Ar_n$ and the application App.

Such constraints are, for example, constraints in terms of execution time, surface and consumed energy.

The first criterion $C_1$ allows a user to determine the hardware blocks $B_1, \ldots, B_n$ that may implement each task $T_1, \ldots, T_n$ of the application App.

The selection step 160 is generally carried out by the processor 14 using the readable information medium 26.

During the selection step 160, a user intervention is generally required in particular using the keyboard 22.

The determining method next comprises a step 170 for determining, in the second exploration space $E_2$, elements satisfying a second criterion $C_2$, the second criterion $C_2$ being different from the first criterion $C_1$ of the selection step 160.

The second criterion $C_2$ specifies the maximum number of separating hardware blocks $B_1, \ldots, B_n$, i.e., serving as intermediaries to convey data or instructions between a first hardware block $B_1$ on which a first task $T_1$ is implemented and a second hardware block $B_2$ on which a second task $T_2$ separate from the first task $T_1$ is implemented.

The maximum number of hardware blocks $B_1, \ldots, B_n$ is specific to the two considered tasks $T_1$, $T_2$. In other words, each group of separate tasks $T_1$, $T_2$ includes a maximum number of hardware blocks $B_1, \ldots, B_n$ serving as intermediaries to convey data or instructions between a first hardware block $B_1$, on which the first task $T_1$ is implemented, and a second hardware block $B_2$, on which the second task $T_2$ is implemented.

The number of hardware blocks $B_1, \ldots, B_n$ serving as intermediaries to convey data or instructions for two separate tasks $T_1$, $T_2$ must be less than or equal to the maximum number of hardware blocks $B_1, \ldots, B_n$ specific to the two tasks $T_1$, $T_2$ in question to respect the second criterion $C_2$.

The maximum numbers of hardware blocks $B_1, \ldots, B_n$ serving as intermediaries to convey data or instructions between two separate tasks $T_1, \ldots, T_n$ are generally comprised between 4 and 20.

For example, the following table summarizes the maximum numbers of hardware blocks $B_1, \ldots, B_n$ serving as intermediaries to convey data or instructions between two separate tasks $T_1, \ldots, T_n$:

|       | $T_1$ | $T_2$ | $T_3$ | $T_4$ | $T_5$ |
|-------|-------|-------|-------|-------|-------|
| $T_1$ | N/A   | 2     | N/A   | N/A   | N/A   |
| $T_2$ | 2     | N/A   | 4     | 4     | N/A   |
| $T_3$ | N/A   | 4     | N/A   | N/A   | 1     |
| $T_4$ | N/A   | 4     | N/A   | N/A   | 2     |
| $T_5$ | N/A   | N/A   | 1     | 2     | N/A   |

In this table, "N/A" means that the two tasks under consideration do not communicate with one another.

This determining step 170 makes it possible to obtain a third exploration space $E_3$ comprising the elements of the second exploration space $E_2$ meeting the second criterion $C_2$.

The third exploration space $E_3$ is for example a matrix whereof the elements are the implementations of each task $T_1, \ldots, T_n$ on each of the hardware blocks $B_1, \ldots, B_n$ of the candidate architectures $Ar_1, \ldots, Ar_n$, those implementations respecting the first criterion $C_1$ and the second criterion $C_2$.

The second criterion $C_2$ is defined by a user, optionally using the table T and the diagram G, so as to guide the placement of the tasks $T_1, \ldots, T_n$ on the hardware blocks $B_1, \ldots, B_n$.

For example, the second criterion $C_2$ makes it possible to specify that the two separate tasks $T_1$, $T_2$ communicating with one another are preferably implemented on hardware blocks $B_1$, $B_2$ such that the data or instructions conveyed between those two blocks $B_1$, $B_2$ cross over a limited number of hardware blocks $B_1, \ldots, B_n$ serving as intermediaries. This limited number of hardware blocks $B_1, \ldots, B_n$ is for example comprised between 1 and 20 for each task $T_1, \ldots, T_n$.

The determining step 170 is generally implemented by the processor 14 using the readable information medium 26.

During the determining step 170, the intervention of a user is generally required, in particular using the keyboard 22.

The determining method next comprises a step 180 for computing, for each of the elements of the third exploration space $E_3$, the quantity of data exchanged between the tasks $T_1, \ldots, T_n$ implemented on the hardware blocks $B_1, \ldots, B_n$.

During that computing step 180, the computed numbers are next compared to a threshold value $V_S$.

The threshold value $V_S$ is chosen such that the execution time resulting from the exchange of data between two blocks $B_1, \ldots, B_n$ is less than or equal to the constraints in terms of execution time imposed by the user.

The computing step 180 makes it possible to obtain a fourth exploration space $E_4$ including the elements of the third exploration space $E_3$ whereof the quantity of exchanged data is less than or equal to the threshold value $V_S$.

The fourth exploration space $E_4$ is for example a matrix whereof the elements are the implementations of each task $T_1, \ldots, T_n$ on each of the hardware blocks $B_1, \ldots, B_n$ of the candidate architectures $Ar_1, \ldots, Ar_n$, those implementations respecting the first criterion $C_1$, the second criterion $C_2$ and the quantity of data exchanged between the tasks $T_1, \ldots, T_n$ implemented on the hardware blocks $B_1, \ldots, B_n$ being less than or equal to the threshold value $V_S$.

The computing step 180 is generally implemented by the processor 14 using the readable information medium 26.

The determining method next comprises a step 190 for optimizing the elements of the fourth exploration space $E_4$ according to a third criterion $C_3$, the third criterion $C_3$ being different from the first criterion $C_1$ and the second criterion $C_2$.

This optimizing step 190 makes it possible to obtain a multi-core architecture $Ar_O$ optimized for the application App, accessible in the form of source code such as VHDL (Hardware Description Language) code able to operate on any family of FPGA components.

A VHDL code is a code produced in a hardware description language designed to represent the behavior and the architecture of a digital electronic system.

An FPGA is a programmable logic circuit, i.e., an integrated logic circuit able to be reprogrammed after manufacturing.

The architecture source code, such as a VHDL code, obtained during step 190 is standardized.

The optimizing step 190 also makes it possible to obtain an application App optionally optimized, for example accessible in the form of a binary code.

The third criterion $C_3$ is defined by a function f called cost function. Such a cost function f for example verifies the following equation $Eq_2$:

$$f = \alpha \cdot Ar + \beta \cdot Perf$$

where $\alpha, \beta$ are weight parameters verifying $\alpha + \beta < 1$,

Ar is a characteristic function of the considered architecture,

Perf is a characteristic function of the performance.

The function Ar evaluates the size of the considered architecture in light of the constraints imposed by the user.

For example, the size of the architecture is expressed in number of Look-Up Tables (LUT), in number of slices, in number of registers and number of gates. A slice is a memory zone allocated to a computer program when it is executed. A register is a memory location inside a processor. A gate is a logic operation.

The function Perf is obtained using a simulation, and in particular a SystemC simulation done by a simulator.

SystemC is a high-level hardware description language. Such a language comprises classes in C++ that introduce the concepts necessary for the hardware modeling. SystemC indeed allows systems modeling with a high behavioral level.

In order to generate the SystemC simulation, the placement of the tasks $T_1, \ldots, T_n$ and the data of the application App on the architecture is provided at the input of the simulator, as well as a coarse model of the behavior of the architecture.

A coarse model of the behavior of an architecture is a model limiting the number of exchanges and synchronizations between the tasks implemented on the modeled architecture.

The SystemC simulation is for example done with the SpearDE tool.

Such a performance evaluation system takes into account at least one of the following elements: the size of the architecture $Ar_1, \ldots, Ar_n$, the quantity of data transferred between the different blocks $B_1, \ldots, B_n$ of an architecture $Ar_1, \ldots, Ar_n$, the bandwidth and size of the memories of the architecture $Ar_1, \ldots, Ar_n$, the bandwidth of the communications of the architecture $Ar_1, \ldots, Ar_n$, and the computing power of the different hardware blocks $B_1, \ldots, B_n$, the placement of the data and the tasks $T_1, \ldots, T_n$.

The parameters $\alpha$ and $\beta$ are set by a user so as to guide or influence the exploration. In particular, the parameter $\alpha$ orients the exploration toward more economical solutions in terms of hardware resources used, while the parameter $\beta$ guides the exploration toward higher performing solutions. These parameters $\alpha$ and $\beta$ are set based on the desires of the user and the constraints that the user sets.

The optimizing step 190 consists of minimizing the cost function f.

This optimizing step 190 comprises three phases.

The first phase consists of exploring all of the candidate architectures $Ar_1, \ldots, Ar_n$ so as to obtain a first set of architectures $Ar_1, \ldots, Ar_n$ adapted to the implementation of the tasks $T_1, \ldots, T_n$ of the application App. This first set of architectures $Ar_1, \ldots, Ar_n$ includes a reduced number of architectures relative to the initial number of candidate architectures $Ar_1, \ldots, Ar_n$.

The second phase consists of obtaining the best implementation of the application App on each of the architectures $Ar_1, \ldots, Ar_n$ obtained during the first phase.

The third phase consists of giving the best partitioning or distribution of the data of the application App for each implementation of the application App obtained during the second phase.

These three phases can be carried out by one or more algorithms.

According to one preferred embodiment, the optimizing step 190 implements at least one evolutionary search algorithm.

An evolutionary search algorithm is in particular an algorithm inspired by the evolution theory to cause a set of solutions to a given problem to evolve with the aim of obtaining an optimal solution.

An evolutionary search algorithm is, for example, a genetic algorithm or a taboo search algorithm.

Genetic algorithms usually use the natural selection method and apply it to a population of potential solutions to the given problem, the solution then being approached through successive iterations.

Taboo search algorithms usually consist, from a given position, of exploring the vicinity thereof and choosing the position in that vicinity minimizing a function serving as criterion for the determination of the best solution to an optimization problem.

In the preferred embodiment, the optimizing step 190 implements three separate evolutionary algorithms each corresponding to a phase of the optimizing step 190.

The optimizing step 190 implements a first genetic algorithm to explore all of the candidate architectures $Ar_1, \ldots, Ar_n$, then a taboo search algorithm to explore all of the implementations of the tasks $T_1, \ldots, T_n$ on the candidate architectures $Ar_1, \ldots, Ar_n$, and lastly a second genetic algorithm to determine the best partitioning of the application data App.

More particularly, the first genetic algorithm makes it possible to obtain a first set of architectures $Ar_1, \ldots, Ar_n$ adapted to the implementation of the tasks $T_1, \ldots, T_n$ of the application App.

When it is executed, the first genetic algorithm is in fact able to select the hardware blocks $B_1, \ldots, B_n$ of the candidate architectures $Ar_1, \ldots, Ar_n$ in particular based on the number and nature and their hardware blocks $B_1, \ldots, B_n$.

For example, the selected architectures $Ar_1, \ldots, Ar_n$ comprise a defined number of hardware blocks $B_1, \ldots, B_n$ of the processor nature, specific processors among the hardware blocks $B_1, \ldots, B_n$ of a processor nature, memories with a specific size and characteristics among the hardware blocks $B_1, \ldots, B_n$ of a memory nature, specific communicators among the hardware blocks $B_1, \ldots, B_n$ of a communicator nature.

The first genetic algorithm has two levels of exploration for a set of solutions: the node level and the platform level.

The nodes are blocks making it possible to build a platform. Two types of physical nodes are considered: active nodes and passive nodes.

The active nodes contain one or more hardware blocks $B_1, \ldots, B_n$ of a processor nature and can be used to perform processing operations. For example, an active node is a processor with a local memory that is specific to it. In another example, an active node comprises several processors and their local memories.

The passive nodes state their addresses to the other nodes. These passive nodes are not capable of performing processing or triggering communications. Such passive nodes can be read or written by the active nodes. For example, the passive nodes are memories shared on an NoC or input or output components.

At the platform, the first genetic algorithm considers the architecture to be a series of input and output components, shared memories and nodes. This allows the first genetic algorithm to compare the advantages of the communication network relative to another, define the optimal number of nodes, shared memories and input and output components.

At the node level, the first genetic algorithm determines whether it is preferable to add active nodes or passive nodes.

To explore the entire solution space, whether at the nodes or at a platform, the first genetic algorithm is able to modify several characteristics from among the following characteristics: the number of hardware blocks $B_1, \ldots, B_n$, the nature of the hardware blocks $B_1, \ldots, B_n$, the local memory of each hardware block $B_1, \ldots, B_n$, the type of hardware blocks $B_1, \ldots, B_n$ of a memory nature, the hierarchy of the architecture and topology of the communicators.

The first genetic algorithm initially has a randomly generated population. Such a random generation makes it possible to obtain a diverse population.

The first genetic algorithm uses operators to find a solution to a problem, in particular a selection operator, a crossing operator and a mutation operator.

A selection operator is used to choose, in a population, the individuals that are most suitable for an algorithm to converge toward an optimal solution.

A crossing operator is used to enrich the diversity of the individuals in a population. In comparison with biology, such an operator performs cross-breeding between different chromosomes in order to create new daughter chromosome sequences. Such cross-breeding takes place with a probability set by a user depending on the optimization problem.

By analogy with biology, a mutation operator is a random change in one or more genes of a chromosome. In general, such a mutation operator makes it possible to keep diversity in the development of individuals and prevents convergence toward a local optimum.

The taboo search algorithm next makes it possible to obtain the best implementation of the application App on each of the architectures $Ar_1, \ldots, Ar_n$ obtained with the first genetic algorithm.

The second genetic algorithm lastly makes it possible to obtain the best partitioning or distribution of the data of the application App for each implementation of the application App obtained with the taboo search algorithm.

A partitioning of data is a division or splitting of the data into several groups so as to distribute them over different parts of an architecture.

In order to help the second genetic algorithm converge toward an optimal solution for the architecture jointly with the application App, it is possible to provide characteristics of the application App in question to the tool implementing the second algorithm.

Figure 4:
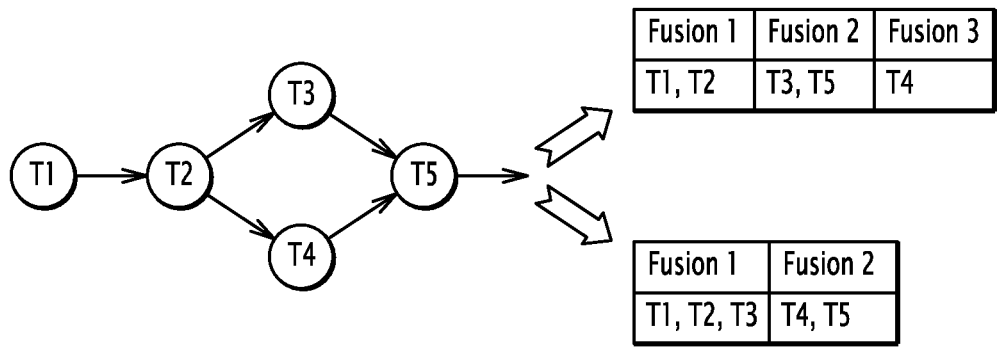

As shown in FIG. 4, from the diagram G grouping together the parallelizable tasks $T_1, \ldots, T_n$, the second genetic algorithm generates chromosomes randomly. The parallelizable tasks $T_1, \ldots, T_n$ are merged, i.e., grouped together on those chromosomes for the purpose of maintaining the locality of the data and thus avoiding needless data transfers, and therefore maintaining performance.

In the example of FIG. 4, two chromosomes are generated from the diagram G. Thus, a first chromosome of this FIG. 4 groups together, in a first fusion, a first task $T_1$ with a second task $T_2$, and in a second fusion, a third task $T_3$ with a fifth task $T_5$. Furthermore, for this first chromosome, a fourth task $T_4$ in a third fusion is not grouped together with any other task. This means that during the execution of the first and second tasks $T_1, T_2$, these two tasks $T_1, T_2$ work on the same data subset. Furthermore, the exchange of data between the first and second tasks $T_1$ and $T_2$ does not require communication via an external memory. Likewise, the exchange of data between the third and fifth tasks $T_3$ and $T_5$ does not involve communication via an external memory. The task $T_4$ is able to read incoming data in an external memory and write outgoing data directly in the external memory. The third fusion with the fourth task $T_4$ results in generating significant communication time and reducing performance.

In the second chromosome example, the first fusion involves communication with the external memory to start the task $T_1$ and write the results of task $T_3$. Meanwhile, the second fusion involves communication with the external memory to start task $T_4$ and write the results of task $T_5$ in the external memory.

The purpose of this step is to reduce the communications with the external memories and optimize communications done within the platform.

The optimizing step 190 is generally implemented by the processor 14 using the readable information medium 26.

Thus, the determining method according to the invention makes it possible to determine and optimize a multi-core architecture $Ar_O$ for a given application App.

Such a determining method has complexity NP, i.e., nondeterministic polynomial time. Such a method therefore requires heuristics to explore all of the solutions.

A heuristic is a computing method that quickly provides a feasible solution, not necessarily optimal or exact, to a difficult optimization problem.

Such a determining method makes it possible to simultaneously take into account the parameters and constraints of the architecture and the application, such parameters and constraints being dependent on one another. An improvement is therefore made relative to the tools of the state of the art, which do not make it possible to take such parameters and constraints into account simultaneously.

Thus, the optimal determination of the multi-core architecture and the corresponding application is facilitated by reducing the solution space, in particular using a parsimonious decomposition.

Indeed, such a reduction of the solution space makes it possible to eliminate the hardware blocks that do not correspond to the desires of the user or the constraints inherent to the architecture and the application, on the one hand. On the other hand, such a reduction in the solution space makes it possible to eliminate the implementations of the application on the candidate architectures that are not satisfactory or do not correspond to a user's desires.

It will be understood that upon this reduction in the solution space, a user intervention makes it possible to remove solutions that the user does not wish to explore from the solution space. Thus, the determination of the best solution using the determining method is implemented only over a reduced solution space, the elements of which are likely to constitute viable solutions.

Inasmuch as the determining method simultaneously explores the characteristics and the potential of each architecture, each implementation and each partition of the data and those characteristics are dependent on one another, the determining method is consequently implemented iteratively, and there is a multitude of potential solutions to explore. Thus, it will be understood that reducing the solution space makes it possible to reduce the exploration time of that solution space, and therefore makes it likelier to find an optimal solution.

More particularly, the exploration of all of the solutions is based on the supply of three inputs, for example, the source code of the application App, a library of candidate architectures, and the constraint files created by the user to steer and/or influence the determining method.

More particularly, the determining method is implemented by five tools that are, for example, a code profiler, a code parallelization tool, a tool for exploring the solution space, a tool for evaluating performance, and a binary code generator.

The tool for exploring the solution space is, for example, implemented in C and Python. However, other implementing languages are also possible, for example C++ or FORTRAN.

The tool for exploring the solution space is for example a Design Space Exploration (DSE) tool.

Thus, during the determining method, the search for the best solution for the architecture and the application is implemented "semi-automatically" inasmuch as the user intervention is required during certain steps of the method only.

This approach differs from a fully automated approach as implemented using HLS tools or a manual approach.

Indeed, a fully automated approach, although quick to implement, is not always optimal regarding the characteristics of the obtained architecture, in particular in terms of frequencies, consumed power or quantities of resources used. Such an architecture obtained with an automated approach is therefore problematic for integration into onboard systems where the frequencies, consumed powers and quantities of usable resources are limited.

The advantages of a "semi-automated" approach relative to a fully optimized approach are, on the one hand, the use of architectures already having been optimized for certain functionalities or certain types of tasks $T_1, \ldots, T_n$. On the other hand, such a "semi-automated" approach makes it possible to steer the exploration of the solution space based on the constraints and desires of the user. It is for example possible to implement several tasks $T_1, \ldots, T_n$ on a same hardware block $B_1, \ldots, B_n$, in particular to reduce the quantity of resources used.

The advantages of a "semi-automated" approach relative to a manual approach are that all of the aspects relative to an exploration of the solution space, in particular the characteristics of the application App, the architecture and the implementation, are taken into account. Indeed, when an exploration tool such as a DSE evaluates a solution, it evaluates the characteristics of the application App, the architecture and the implementation, whereas those characteristics are dependent on one another. The final solution is therefore a compromise between the characteristics of the application App, the architecture and the implementation.

Another advantage of a "semi-automated" approach relative to a manual approach is that the definition of the optimal architecture is partly automated, and the user is no longer addressed for the most exhaustive steps. In the "semi-automated" approach, the main role of the user is to assign a group of hardware blocks $B_1, \ldots, B_n$ to each task $T_1, \ldots, T_n$ of the application App. The identification of the best possible compromise to optimize both the application and the architecture is done automatically.

Lastly, another advantage of the invention is that it makes it possible to reduce the design time of the optimal architecture and the corresponding application, and therefore to reduce the time before the initial marketing.

During the optimizing step 190, the combination of three evolutionary algorithms makes it possible to explore each architecture and interaction with each possible implementation and each possible data partition. This combination of three evolutionary algorithms thus ensures the determination of a better compromise for the architecture and the corresponding application.

Furthermore, during the implementation of the determining method, a source code for the architecture corresponding to the best solution is obtained automatically. This source code comprises several families of accelerators, for example, dataflow accelerators or General Purpose Processors. Such an architecture source code is of interest relative to the architectures generated using HLS tools. Indeed, such HLS tools are primarily built from dataflow accelerators, which may be limiting in onboard fields, where the quantity of available resources is limited.

Furthermore, since the architectures are built using devices that do not take into account the complexity of the communications, the architecture $Ar_O$ obtained using the determining method is completely transparent, i.e., easy to handle, for a user.

The determining method is quick to implement with time savings of approximately several months relative to manual optimization, in particular owing to the various criteria $C_1$, $C_2$, $C_3$ and threshold values $V_S$ able to reduce the initial exploration space $E_1$.

The performance of the architecture $Ar_O$ obtained with such a method, in particular in terms of execution time, is close to that which would be obtained manually. In particular, with such a method, one obtains less than 7% on average in terms of excess costs over the operating time.

Thus, the determining method of a multi-core architecture by optimization for a given application according to the invention is quick to implement while providing a multi-core architecture with performance levels in terms of execution time, surface and consumed energy closed the performance levels of a manual optimization technique. Optionally, when the optimization of the elements of the fourth exploration space $E_4$ does not meet the third criterion $C_3$, the determining method comprises a storage step 200.

That storage step 200 consists on the one hand of storing, in a fifth exploration space $E_5$, the elements of the first exploration space $E_1$ that do not meet the first criterion $C_1$, i.e., the limitations of the tasks $T_1, \ldots, T_n$ on hardware blocks $B_1, \ldots, B_n$ not meeting the first criterion $C_1$.

This storage step 200 furthermore consists of storing, in a sixth exploration space $E_6$, the elements of the second exploration space $E_2$ to that do not meet this criterion $C_2$ or the first criterion $C_1$, i.e., the implementations of the tasks $T_1, \ldots, T_n$ on the hardware blocks $B_1, \ldots, B_n$ not satisfying the first criterion $C_1$ or the second criterion $C_2$.

The fifth exploration space $E_5$ and the sixth exploration space $E_6$ are for example matrices. The element of the matrix of the fifth exploration space $E_5$ is the implementations of the tasks $T_1, \ldots, T_n$ of the application App on the hardware blocks $B_1, \ldots, B_n$ not meeting criterion $C_1$. The element of the matrix of the sixth exploration space $E_6$ is the implementations of the tasks $T_1, \ldots, T_n$ of the application App on the hardware blocks $B_1, \ldots, B_n$ not meeting the first criterion $C_1$ or the second criterion $C_2$.

The selection step 160 further comprises adding elements from the fifth exploration space $E_5$ to the second exploration space $E_2$.

The determining step 170 further comprises adding elements from the sixth exploration space $E_6$ to the third exploration space $E_3$, such that the optimizing step 190 is carried out over a broader solution space.

The invention claimed is:

1. A method for determining by optimization a multi-core architecture and a way of implementing an application on the architecture for a given application, the method comprising:
providing a parallelized application, a parallelized application being a set of tasks,
providing candidate architectures, each candidate architecture comprising different hardware blocks, a hardware block having a specific nature and being able to execute one or more tasks,
defining a first exploration space whose elements are the different ways of implementing the application on each of the candidate architectures,
selecting, in the first exploration space, the elements verifying a first criterion according to which each task of the application is suitable for being implemented on only one or several hardware blocks, to obtain a second exploration space comprising the elements of the first exploration space meeting the first criterion,
determining, in the second exploration space, the elements verifying a second criterion, the second criterion being different from the first criterion and requiring that the number of hardware blocks separating a first hardware block implementing a first task and a second hardware block implementing a second task different from the first task, is less than or equal to a value specific to the two tasks in question, to obtain a third exploration space comprising the elements of the second exploration space meeting the second criterion,
computing the number of data exchanged between the hardware blocks for each of the elements of the third exploration space and comparing each computed number to a threshold value, in order to obtain a fourth exploration space comprising the elements of the third exploration space whose number of exchanged data is less than or equal to the threshold value, and
optimizing the elements of the fourth exploration space according to a third criterion, the third criterion being different from the first criterion and from the second criterion.

2. The method according to claim 1, wherein the selection step comprises the parsimonious decomposition of the elements of the first exploration space into a dictionary, the dictionary being a matrix whose elements meet the first criterion, the elements resulting from the parsimonious decomposition belonging to the second exploration space.

3. The method according to claim 1, wherein the method further comprises the following steps:
determining, in the application, the tasks that can be performed at the same time by two separate hardware blocks of a same candidate architecture to obtain a diagram grouping all of the tasks performable in parallel,
evaluating the needs necessary to implement each of the tasks of the application on specific hardware blocks of the candidate architectures in order to obtain a table grouping the needs of each of the tasks of the application when the considered tasks are performed on said hardware blocks,
optimizing the application based on the table and the diagram to reduce the volume of the tasks or the volume of the data transferred between the tasks of the application.

4. The method according to claim 3, wherein the first criterion is defined by a user based on the table and based on constraints specific to the candidate architectures and the application.

5. The method according to claim 1, wherein the method further comprises the following steps:
storing, in a fifth exploration space, the elements of the first exploration space which does not meet the first criterion,
storing, in a sixth exploration space, the elements of the second exploration space which does not meet the second criterion,
the selection step further comprising the addition of the elements of the fifth exploration space into the second exploration space and the determining step further comprising the addition of the elements of the sixth exploration space into the third exploration space, the storage steps being carried out during the method only when the optimization of the elements of the fourth exploration space does not meet the third criterion.

6. The method according to claim 1, wherein the threshold value of the computation step is below the constraints in terms of execution time of the user.

7. The method according to claim 1, wherein the third criterion is defined by a function whose parameters comprise the size of the architecture, the number of data transferred between the different blocks of an architecture, the bandwidth and the size of the memories of the architecture, the bandwidth of the communicators of the architecture, the computing power of the different hardware blocks and the placement of the data and of the tasks).

8. The method according to claim 1, wherein the natures of the hardware blocks are chosen from among processors, memories and communicators, the hardware blocks making up the candidate architectures having previously been optimized for one or more functionalities or specific tasks.

9. The method according to claim 1, wherein the optimization step according to the third user criterion implements at least one evolutionary search algorithm, such as a genetic algorithm or a taboo search algorithm.

10. A non-transitory computer-readable storage medium including a computer program being able to be loaded on a data processing unit and determining by optimization a multi-core architecture and a way of implementing an application on the architecture for a given application, comprising:

an instruction for providing a parallelized application, a parallelized application being a set of tasks, an instruction for providing candidate architectures, each candidate architecture comprising different hardware blocks, a hardware block having a specific nature and being able to execute one or more tasks, an instruction for defining a first exploration space whose elements are the different ways of implementing the application on each of the candidate architectures, an instruction for selecting, in the first exploration space, the elements verifying a first criterion according to which each task of the application is suitable for being implemented on only one or several hardware blocks, to obtain a second exploration space comprising the elements of the first exploration space meeting the first criterion, an instruction for determining, in the second exploration space, the elements verifying a second criterion, the second criterion being different from the first criterion and requiring that the number of hardware blocks separating a first hardware block implementing a first task and a second hardware block implementing a second task different from the first task, is less than or equal to a value specific to the two tasks in question, to obtain a third exploration space comprising the elements of the second exploration space meeting the second criterion, an instruction for computing the number of data exchanged between the hardware blocks for each of the elements of the third exploration space and comparing each computed number to a threshold value, in order to obtain a fourth exploration space comprising the elements of the third exploration space whose number of exchanged data is less than or equal to the threshold value, and an instruction for optimizing the elements of the fourth exploration space according to a third criterion, the third criterion being different from the first criterion and from the second criterion.

* * * * *